(12) United States Patent
Megarity, Jr. et al.

(10) Patent No.: US 9,917,033 B2
(45) Date of Patent: Mar. 13, 2018

(54) MULTICOMPONENT HEAT SINK WITH MOVABLE FIN SUPPORT PORTION

(75) Inventors: William M. Megarity, Jr., Roxboro, NC (US); Luke D. Remis, Raleigh, NC (US); Gregory D. Sellman, Morrisville, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 1498 days.

(21) Appl. No.: 13/533,376

(22) Filed: Jun. 26, 2012

(65) Prior Publication Data

US 2013/0340989 A1 Dec. 26, 2013

(51) Int. Cl.
*H01L 23/40* (2006.01)

(52) U.S. Cl.
CPC .. *H01L 23/4006* (2013.01); *H01L 2023/4081* (2013.01); *H01L 2924/0002* (2013.01); *Y10T 29/49826* (2015.01)

(58) Field of Classification Search
CPC . H01L 23/4006; H01L 23/40; H01L 23/4093; F28D 2021/0029
USPC ............... 165/185, 80.3; 361/710, 719, 610; 439/487, 331
See application file for complete search history.

(56) References Cited

U.S. PATENT DOCUMENTS

| | | | |
|---|---|---|---|
| 6,086,387 A * | 7/2000 | Gallagher et al. | 439/71 |
| 6,137,683 A | 10/2000 | Lee et al. | |
| 6,205,023 B1 * | 3/2001 | Moribe et al. | 361/704 |
| 6,547,580 B1 * | 4/2003 | Leavitt et al. | 439/266 |
| 6,989,990 B2 | 1/2006 | Malone et al. | |
| 7,036,574 B2 | 5/2006 | Thompson et al. | |
| 7,733,652 B2 | 6/2010 | Costello et al. | |
| 7,876,566 B1 | 1/2011 | Frisch et al. | |
| 8,056,614 B2 | 11/2011 | Chen et al. | |
| 2004/0063343 A1 * | 4/2004 | Murr | 439/69 |
| 2005/0030718 A1 * | 2/2005 | Villanueva et al. | 361/710 |
| 2006/0007652 A1 * | 1/2006 | Yatskov et al. | 361/687 |
| 2008/0239677 A1 | 10/2008 | Coleman et al. | |
| 2010/0165578 A1 * | 7/2010 | Kearns | 361/719 |
| 2012/0024512 A1 * | 2/2012 | Yamamoto et al. | 165/185 |
| 2013/0126145 A1 * | 5/2013 | Glover et al. | 165/185 |
| 2013/0138262 A1 * | 5/2013 | Busch et al. | 700/300 |
| 2013/0208427 A1 * | 8/2013 | Lin et al. | 361/720 |
| 2013/0342997 A1 * | 12/2013 | Yeh | 361/704 |

FOREIGN PATENT DOCUMENTS

WO  WO2011053307 A1  5/2011

* cited by examiner

*Primary Examiner* — Grant Moubry
*Assistant Examiner* — Raheena R Malik
(74) *Attorney, Agent, or Firm* — Jeffrey L. Streets

(57) ABSTRACT

A heat sink comprises a base and a fin support larger in area than the base and supporting fins that may be positioned in a plurality of orientations relative to the base. The base is adapted for being connected to a heat-generating electronic component on a circuit board, and the heat sink dissipates heat generated by the heat-generating electronic device and conducted through the base and the fin support to the fins supported thereon. The heat sink dissipates heat from the heat-generating electronic device in a first operable position and in a second operable position. The heat sink may be moved from the first to the second operable position to facilitate access to electrical contacts proximal the heat-generating electronic component.

16 Claims, 11 Drawing Sheets

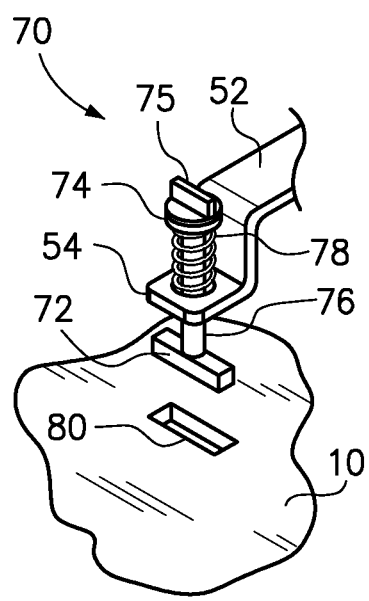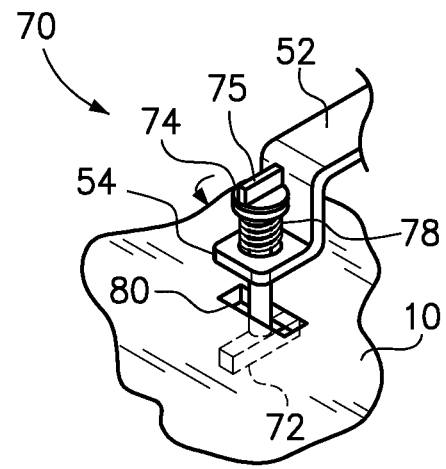
*FIG. 13*  *FIG. 14*

MULTICOMPONENT HEAT SINK WITH MOVABLE FIN SUPPORT PORTION

BACKGROUND

Field of the Invention

The present invention relates to heat sinks for removing heat from heat-generating electronic components used in computers.

Background of the Related Art

Computer systems require removal of heat from heat-generating electronic components such as processors. Heat-generating electronic components are generally coupled to a generally planar host card such as a mother board having a series of electrical contacts to facilitate electronic engagement among the heat-generating component, the motherboard and other components that may be connected to the motherboard. Electrical current and/or data are routed to the heat-generating electronic components through the motherboard and through electrical contacts on or adjacent to the motherboard.

Heat generated by the electronic component is conducted to a heat sink. A plurality of fins may be coupled to the heat sink to dissipate heat from the electronic component to an airflow induced within the computer chassis by air movers such as fans. Alternately, an air flow within the chassis may be provided by air movers outside the computer chassis such as fans installed to move air within a server room or within a server rack in which the computer chassis is installed.

The heat transfer capacity of the heat sink depends in part on the length, height and number of fins on the heat sink. In order to provide sufficient cooling, a heat sink may comprise one or more portions that extend beyond the areal boundaries of the heat-generating electronic device to which the heat sink is coupled. Such overhanging portions of a heat sink provide additional area on which to support additional fins, longer fins or other features to increase the capacity of the heat sink to dissipate heat from the fins to the airflow across the fins.

In order to make the most efficient use of limited space, electrical components are frequently disposed on a motherboard in close proximity to other components, such as the processor. In some cases, electrical components on a motherboard are disposed so close to the processor or other heat-generating electronic component that an overhanging portion of a heat sink on the processor may obstruct access to one or more electrical contacts on the motherboard, thereby obstructing attempts to test components of the motherboard during operation of the components and the processor by contacting nodes or conductive pathways underneath the overhanging portion.

BRIEF SUMMARY

One embodiment of the present invention provides a heat sink comprising a thermally conductive base secured in contact with a heat-generating electronic device secured to a mother board, a thermally conductive fin support having a base side, a fin side and a plurality of fins extending from the fin side wherein the base side of the fin support engages the base and the fin support extends beyond an edge of the base to form an overhanging portion disposed over an area of the motherboard adjacent the heat-generating electronic device, and a pivot member pivotally coupling the fin support to the base to facilitate pivoting of the fin support between a first operable position disposing the overhanging portion of the fin support in an obstructing position relative to an electronic component on the mother board and a second operable position with the overhanging portion of the fin support removed from the obstructing position to facilitate testing of the electronic component.

Another embodiment of the present invention provides a method, comprising: securing a heat-generating electronic device to a circuit board; engaging the heat-generating electronic device with a base of a heat sink; engaging the base of the heat sink with a base side of a fin support larger in area than the base, wherein the fin support obstructs access to at least one contact within an overhanged portion of the circuit board proximal the heat-generating electronic device; supporting a plurality of fins on a fin side of the fin support; and coupling the fin support to the base with a fastener. The method further comprises: providing an electrical current to the heat-generating electronic device; conducting heat from the heat-generating electronic device through the base to the fin support; dissipating heat from the fin support through the plurality of fins; sliding the fin support along the base from a first operable position to a second operable position to allow access to the at least one contact; and accessing the at least one contact with a testing device.

BRIEF DESCRIPTION OF THE SEVERAL VIEWS OF THE DRAWINGS

FIGS. 13 and 14 are perspective views of an alternative embodiment of a spring plunger that can be used to secure the base of FIGS. 11 and 12 in contact with a processor.

DETAILED DESCRIPTION

One embodiment of the present invention provides a heat sink having a base secured in contact with a heat-generating electronic device, a fin support having a base side to contact the base and a fin side to support a plurality of fins, and a pivot member coupling the fin support to the base to facilitate movement of the fin support between a first operable position and at least a second operable position.

Alternate embodiments of the heat sink comprise a second pivot member wherein the first pivot member and the second pivot member are removable to facilitate pivoting of the fin support about the remaining pivot member to facilitate access to different electronic components secured to the circuit board in close proximity to the heat-generating electronic component.

Embodiments of the heat sink may comprise a thermally conductive material disposed intermediate the base and the base side of the fin support to promote conductive heat transfer from the base to the fin support for dissipation of heat from the fins. The thermally conductive material may further provide lubrication to promote smooth sliding movement of the base side of the fin support on the base. The thermally conductive material may comprise, for example, liquid metal or thermal grease.

Figure 1:
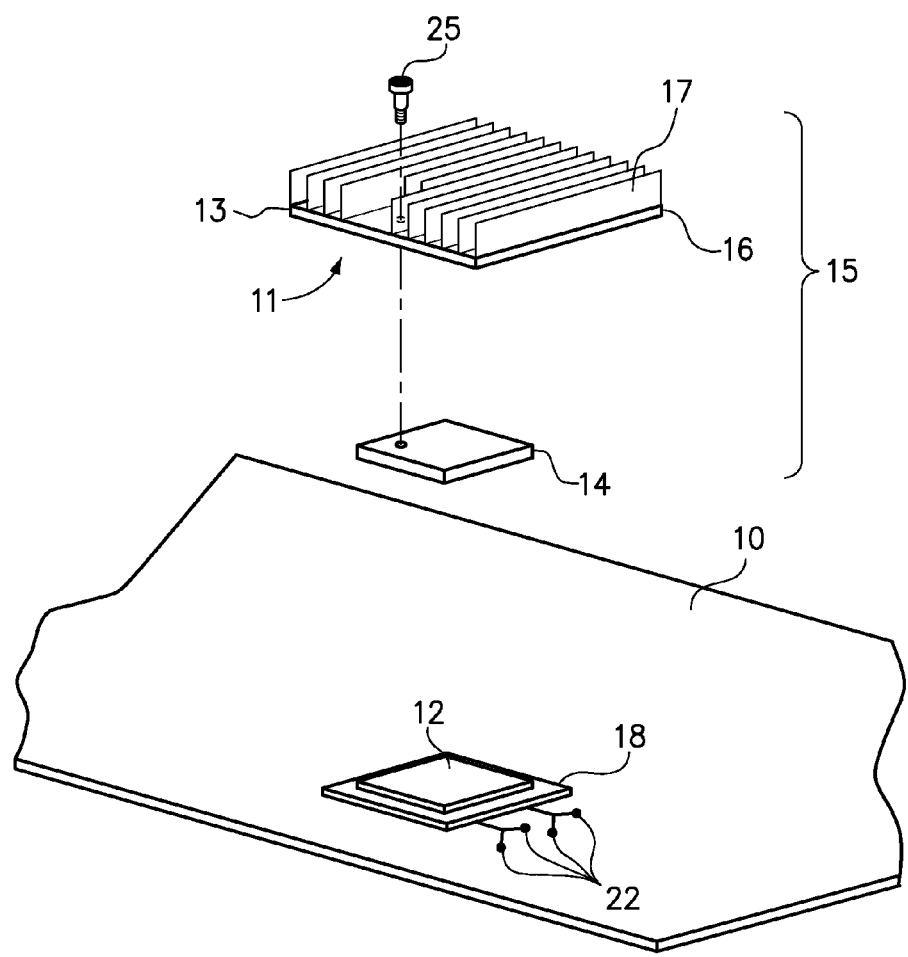
FIG. 1 is a partially exploded perspective view of a motherboard adapted for being disposed within a computer chassis (not shown), a processor secured to the motherboard, and a heat sink of the present invention having a base portion and a larger fin support portion aligned for securing to the processor.

FIG. 1 is a perspective view of a mother board 10 adapted for being disposed within a computer chassis (not shown) and having a processor socket 18 thereon to receive and electronically connect to a heat-generating electronic device, such as a processor 12. A multicomponent heat sink 15 has a base 14 that is adapted for contact with the processor 12 and couples to a fin support 16, for example using a screw 25 as described further in relation to FIGS. 3 and 4. The base 14 may be adhered or otherwise attached directly to the exposed top surface of the processor 12, for example with a thermal epoxy. However, the base may alternatively be secured directly to the motherboard 10 or the socket 18. The processor 12 is electronically coupled through the socket 18 to one or more electronic contacts 22 on the motherboard 10. The electronic contacts 22 are in close proximity to the socket 18 and the processor 12 secured thereto.

The fin support 16 of the heat sink 15 has a substantially larger area than the processor 12 and the base 14 to which the fin support 16 is securable. The base preferably has an area that is at least as large as the area of the processor 12 in order to support heat transfer, but not much larger than the area of the socket 18 in order to avoid obstructing access to the contacts 22. The fin support 16 has a base side 11 to engage the base 14 and a fin side 13 to support a plurality of fins 17.

Figure 2:
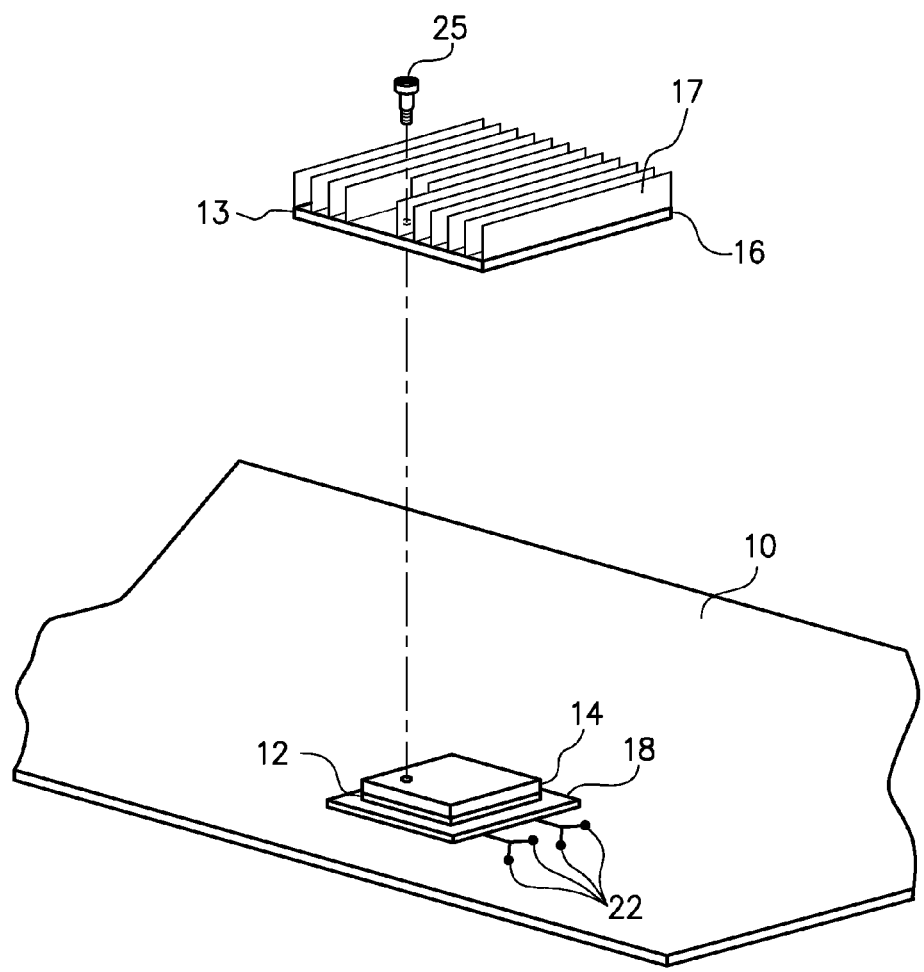
FIG. 2 is the perspective view of the motherboard of FIG. 1 after the base portion of the heat sink is in contact with the processor to receive heat generated by the processor.

FIG. 2 is the perspective view of the motherboard 10 of FIG. 1 after the base 14 of the heat sink is secured in contact with the processor 12 to receive heat generated by the processor 12. In one embodiment of the heat sink of the present invention, the base 14 has the same area as the processor 12 which the heat sink is to cool. This configuration prevents the base 14 itself from obstructing test access to electrical contacts 22 on the motherboard 10 in close proximity to the socket 18.

Figure 3:
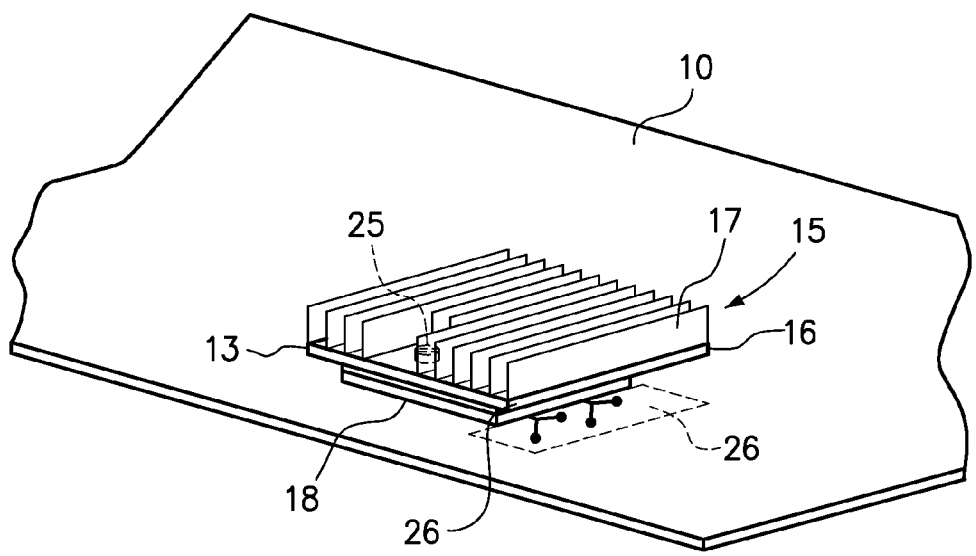
FIG. 3 is the perspective view of FIG. 2 after the fin support of the heat sink is coupled to the base of the heat sink and obstructs access to electrical contacts on a portion of the motherboard in close proximity to the processor.

FIG. 3 is the perspective view of FIG. 2 after the fin support 16 of the heat sink 15 is coupled to the base 14 (not visible in FIG. 3) of the heat sink 15 with the screw 25. In this configuration, the heat sink 15 will dissipate heat generated by the processor 12 (not visible in FIG. 3), which heat is conducted to the fins 17 on the fin support 16 through the base 14 (not shown in FIG. 3). A larger area of the fin support 16 advantageously allows more fins 17 and/or longer fins 17 to be supported on the fin support 17 for increased heat dissipation capacity. However, the fin support 17 forms an overhanging portion that obstructs access to the electrical contacts 22 in an overhanged portion 26 on the motherboard 10 and in close proximity to the processor 12.

Figure 4:
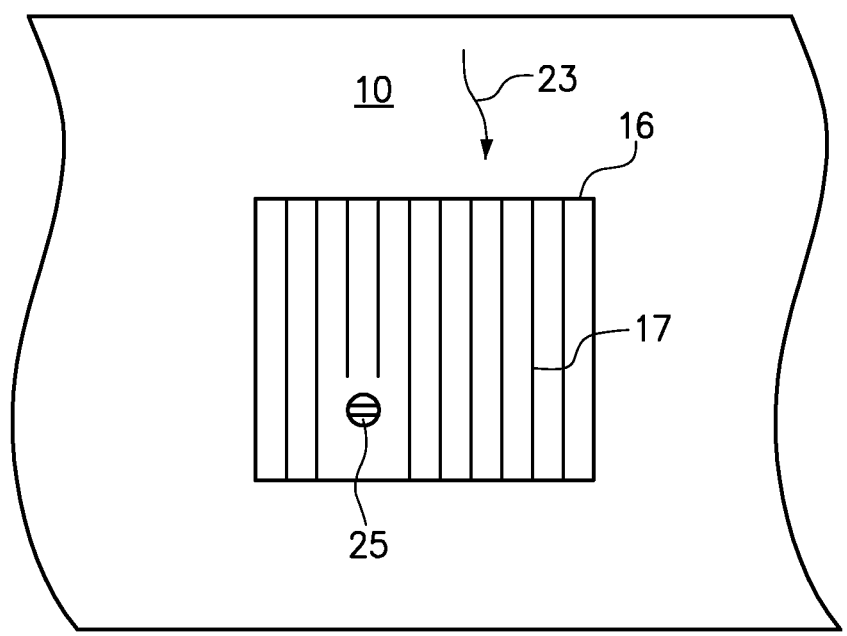
FIG. 4 is a plan view of the motherboard and the heat sink of FIG. 3 revealing a pivot member coupling the fin support to the base (not shown).

FIG. 4 is a plan view of the mother board 10 and the heat sink of FIG. 3 revealing a pivot member 25 provided to couple the fin support 16 to the base (not shown in FIG. 4) and to advantageously position the fins 17 of the fin support 16 in alignment with an airflow 23 provided by, for example, an air mover (not shown) disposed within the computer chassis or across a test station (not shown). It will be understood that the spacing and the number of fins 17 supported on the fin support 16 may vary. The pivot member 25 may comprise a screw, a pin, a post or other fastener or structure.

Figure 5:
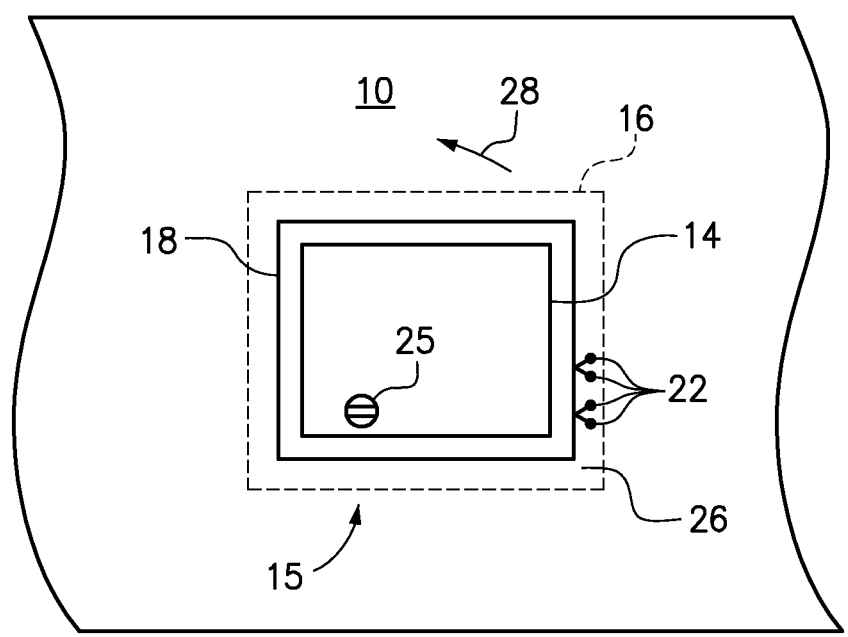
FIG. 5 is the plan view of FIG. 4 with the fin support removed (shown in outline form only) to reveal the position of the electrical contacts on the mother board in close proximity to the processor such that access to test the electrical contacts is obstructed by an overhanging portion of the fin support.

FIG. 5 is the plan view of FIG. 4 with the fin support 16 (shown in dashed lines) removed to reveal the relative positions of the base 14 of the heat sink 15 and of the electronic contacts 22 in the overhanged portion 26 of the motherboard 10 and in close proximity to the processor (not shown in FIG. 5) underneath and in contact with the base 14. A perimeter of the fin support 16 is shown in FIG. 5 to illustrate the size and the extent of the obstruction presented by the overhanging portion of the fin support 16 that extends beyond the base 14. Accordingly, the fin support 16 of the heat sink 15 forms an obstruction that prevents a test instrument from gaining access to electrical contacts 22 in the overhanged portion 26 of the motherboard 10.

Embodiments of the heat sink 15 of the present invention facilitate access to electronic components or contacts that are disposed on a motherboard in close proximity to the processor 12 by facilitating movement of the fin support 16 of the heat sink 15 relative to the base 14 that is secured in a fixed position contacting the processor 12. Specifically, by coupling the fin support 16 to the base 14 using a pivot member 25, the fin support 16 is movable about the pivot member 25 between a first operable position, illustrated in FIGS. 4 and 5 (in which access to the overhanged portion 26 of the motherboard 10 is obstructed) and at least a second operable position illustrated in FIG. 6 (in which access to the overhanged portion 26 is available to afford access to test the electrical contacts 22).

Figure 6:
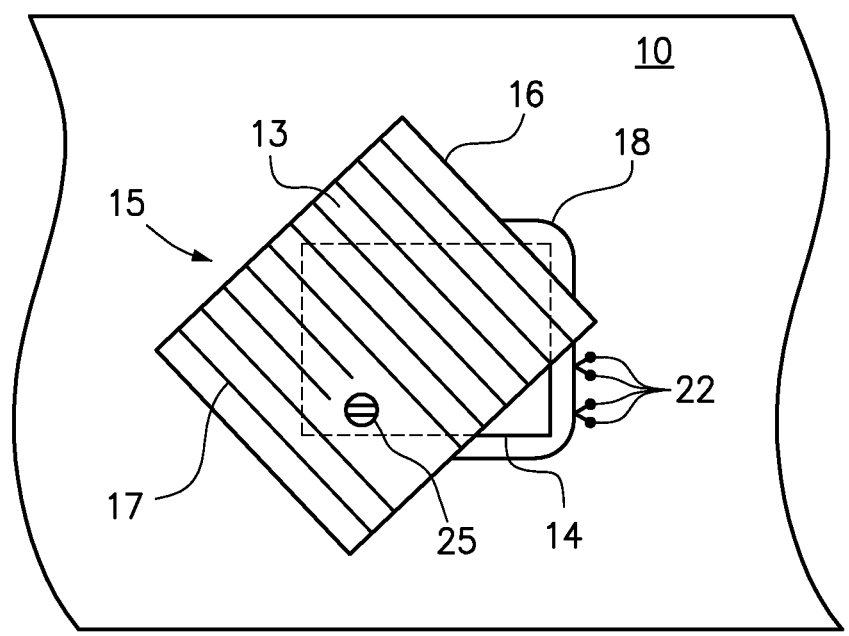
FIG. 6 is the plan view of FIG. 5 after the fin support of the heat sink is rotated about 45 degrees counterclockwise relative to the base and about the pivot member to facilitate access to test the electrical contacts for testing.

FIG. 6 is the plan view of FIG. 5 after the fin support 16 of the heat sink 15 is rotated about 45 degrees counterclockwise relative to the base 14 of the heat sink 15 about the pivot member 25 to facilitate access to the electrical contacts 22 for testing. While the orientation of the fin support 16 in FIG. 6 provides access to the electrical contacts 22, it will be noted that the fins 17 on the fin support 16 are now in a substantially different orientation as compared to the orientation of the fins 17 in FIG. 4. However, the heat sink of the present invention may be used in a test environment where the cover around the motherboard has been removed and the airflow pattern is different than when the system has parallel airflow. As a result, it may not be detrimental for the fins to be temporarily orientated at an angle.

Figure 7:
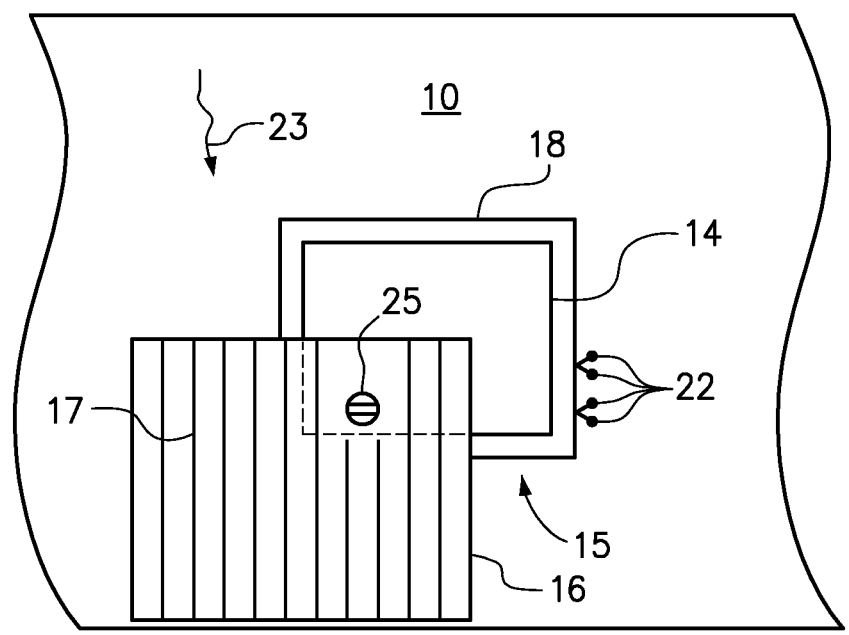
FIG. 7 is the plan view of FIG. 6 after the fin support of the heat sink is rotated an additional 135 degrees relative to the base and about the pivot member to re-align the fins on the fin side of the fin support with an airflow across the heat sink to facilitate the removal of heat generated by the processor to the airflow.

FIG. 7 is the plan view of FIG. 6 after the fin support 16 of the heat sink 15 is rotated an additional 135 degrees counterclockwise relative to the base 14 about the pivot member 25 to re-align the fins 17 with an airflow 23 across the heat sink 15. Alignment of the fins 17 with the airflow 23 provides for the most efficient transfer of heat from the fins 17 to the airflow 23. The configuration of the heat sink 15 illustrated in FIG. 7 will not be as efficient as the configuration in FIG. 4 because the area of the engagement between the fin support 16 and the base 14 is smaller than the area of the engagement between the fin support 16 and the base 14 of the heat sink 15 illustrated in FIG. 4. It will be understood that all heat originating in the processor 12 (not shown in FIG. 7) that is removed from the fins 17 to the air flow 23 will be conductively transferred from the base 14 to the fin support 16 through the area of the engagement between the base side 11 of the fin support 16 (base side 11 not shown in FIG. 7) and the base 14. While the heat transfer capacity of the heat sink 15 in the configuration illustrated in FIG. 4 may exceed the heat transfer capacity of the configurations of the heat sink 15 illustrated in FIGS. 6 and 7, the configuration of the heat sink 15 of FIG. 4 provides sufficient heat transfer capacity to allow a workload to be applied to the processor 12 during testing of the electrical contacts 22 and associated components.

Figure 8:
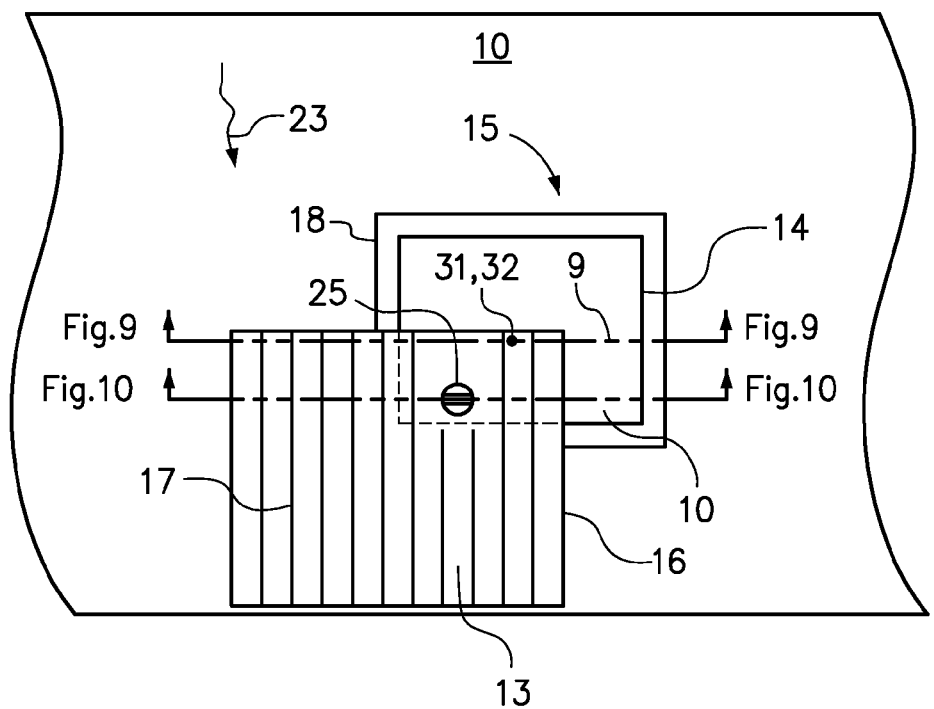
FIG. 8 is the plan view of FIG. 7 wherein the heat sink further comprises a protrusion on a base side of the fin support receivable in a détente on the base to secure the fin support in a position to align the fins with the airflow.

FIG. 8 is a plan view of a heat sink 15 having a fin support 16 rotatable relative to a base 14 and about a pivot member 25 to re-align a plurality of fins 17 on a fin side 13 of the fin support 16 with an airflow 23 directed across the heat sink 15 to facilitate removal of heat generated by a processor (not shown in FIG. 8) to the airflow 23. The heat sink 15 further comprises a protrusion 31 on a base side (not shown in FIG. 8) of the fin support 16 receivable in a détente 32 on the base 14 to secure the fin support 16 in a predetermined rotational position relative to the base 14 to re-align the fins 17 with the airflow 23. It will be understood that the aligned orientation between the fins 17 and the airflow 23 in FIG. 8 will maximize the heat transfer capacity of the heat sink 15. It will be further understood that the location of the protrusion 31 on the fin support 16 and the corresponding location of the détente 32 on the base 14 can be in a number of alternate positions with equal effectiveness. It will be further understood that, in alternate embodiments of the heat sink 15 of FIG. 8, the protrusion 31 may be on the base 14 and the détente 32 to receive to protrusion 31 may be on the fin support 16.

Figure 9:
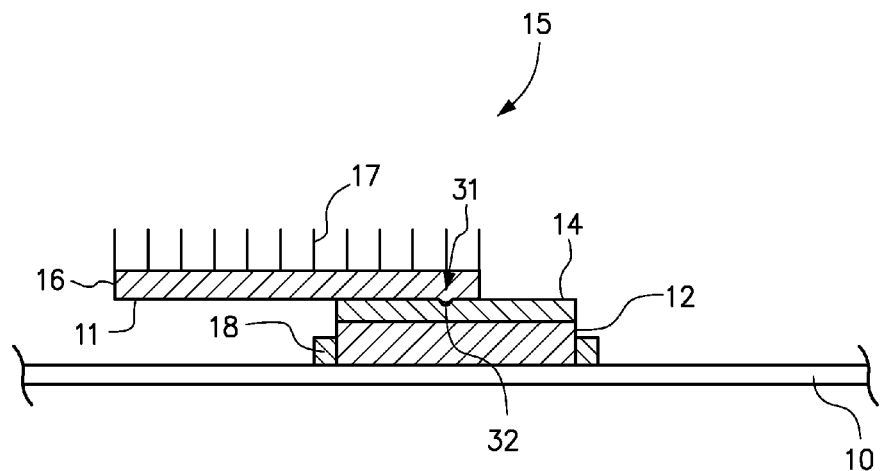
FIG. 9 is a cross-sectional side view of the heat sink of FIG. 8 revealing the protrusion on the fin support received in the détente on the base.

FIG. 9 is a cross-sectional side view of the heat sink 15 of FIG. 8 revealing the protrusion 31 on the base side 11 of the fin support 16 received in the détente 32 on the base 14 to secure the fin support 16 in a predetermined position relative to the base 14. In an alternate embodiment, a protrusion 31 may be disposed on the base 14 to be received into a détente 32 disposed on the fin support 16 when the fins 17 on the fin support 16 are aligned with the airflow 23 (not shown in FIG. 9).

It will be understood that, in one embodiment of the heat sink 15 of the present invention, the pivot member 25 may comprise a screw having a head to engage and apply an engaging force to the fin support 16 to secure the fin support 16 in a position relative to the base 14. In some embodiments, a screw 25 may provide an independent heat path for heat transfer from the base 14 to the fin support 16; that is, heat may be transferred from the base 14 to the fin support 16 through engagement of the base 14 with the base side 11 of the fin support 16 and also from the base 14, through the screw threads (not shown), the screw shaft (not shown) and the screw head 25 to the fin side 13 (not shown in FIG. 9) of the fin support 16.

Figure 10:
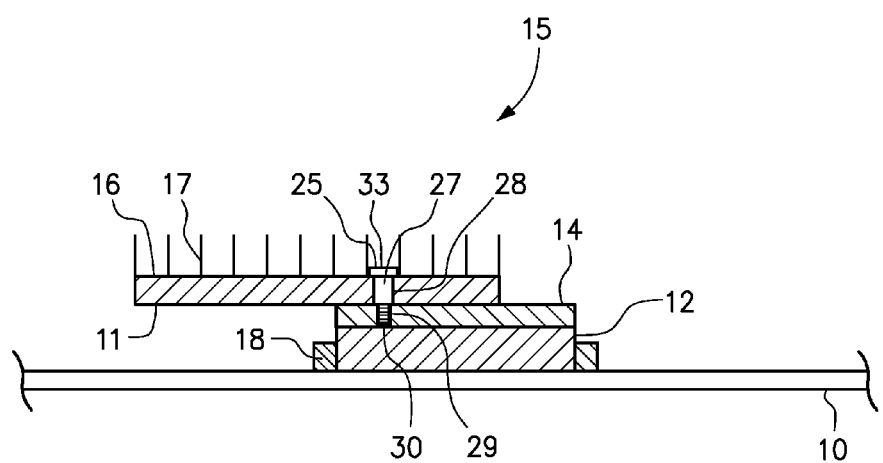
FIG. 10 is a cross-sectional side view of the heat sink of FIG. 8 revealing a configuration of a screw, having a head substantially larger than the shaft, penetrating the fin support through a hole and threadably engaging a threaded screw hole in the base.

FIG. 10 is a section view of the heat sink 15 of FIG. 8 revealing a configuration of a screw 25 having a head 33, shaft portion 27, and a threaded portion 30. The screw 25 is shown in FIG. 10 and in FIG. 8 in the engaged configuration with the shaft portion 27 penetrating a hole 28 in the fin support 16 and the threaded portion 30 engaging a threaded screw receiving hole 29 in the base 14. The screw receiving hole 29 in the base 14 comprises threads to engage the threaded portion 30 of the screw 25. The screw receiving hole 29 may penetrate the base 14 or it may, as shown in FIG. 10, terminate short of penetrating the base 14. FIG. 10 illustrates the hole 28 in the fin support 16 being positioned intermediate a pair of adjacent fins 17 on the fin support 16 to position the head 33 of the screw 25 to engage the fin side of the fin support 16 intermediate an adjacent pair of fins 17. Alternately, a fin 17 may have an interruption to accommodate the head 33 of the screw 25.

Figure 11:
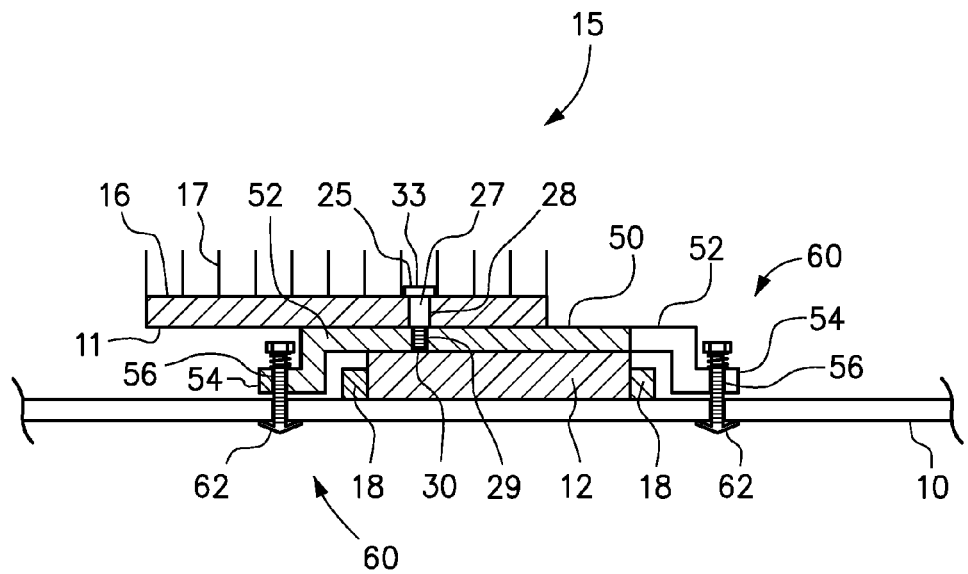
FIG. 11 is a cross-sectional side view of the heat sink having an alternative embodiment of a base that is secured to the motherboard rather than being adhered to the processor.

FIG. 11 is a cross-sectional side view similar to FIG. 10, but illustrating an alternative embodiment of a base 50 that is secured to the motherboard 10 rather than being adhered to the processor 12. The base 50 has a flat central portion for thermal contact with the processor 12 as did base 14 of FIGS. 1-10. However, the base 50 includes a pair of ears 52 extending away from the central portion of the base on opposing sides of the base 50. The ears 52 extend beyond the socket 18, then bend toward the motherboard 10 before forming a flange 54. Each flange 54 has a hole 56 for receiving a spring plunger 60 that is used to secure the base 50 to the motherboard 10. The spring plunger 60 has a plunger tip 62 that is forced through a hole in the motherboard, then expands back to its full diameter to prevent the plunger tip 62 from being pulled back through the hole. The spring plunger 60 is discussed further with reference to FIG. 12.

Figure 12:
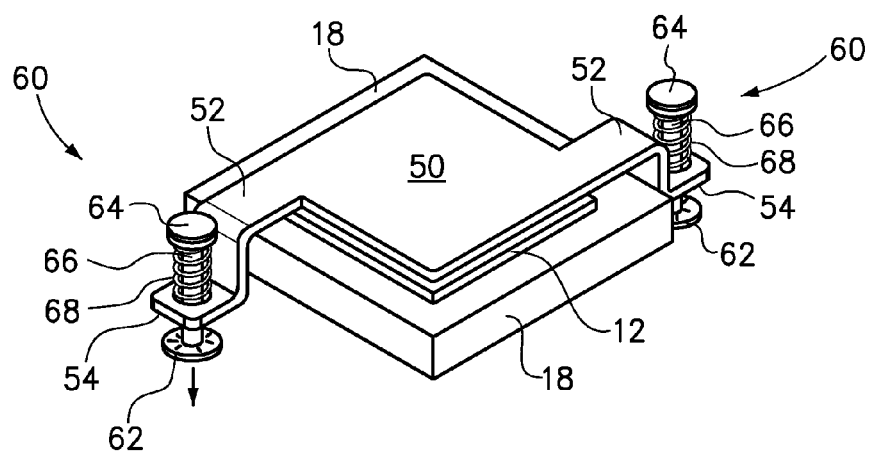
FIG. 12 is a perspective view of the base of FIG. 11 that can be secured to a motherboard to contact a processor.

FIG. 12 is a perspective view of the base 50 of a heat sink that can be secured to a mother board (not shown) to contact a processor 12 in a socket 18 straddled by the base 50. The base 50 comprises a pair of ears 52 on opposing sides of the central processor-contacting portion of the base. Each of the ears 52 extends outward and downward, then forms a flange 54 having a hole therethrough. Each of a pair of spring plungers 60 has a head 64, a shaft 66 that extends through the hole in the flange 54 (see hole 56 in FIG. 11), a plunger tip 62 on the end of the shaft opposite the head, and a compression spring 68 disposed between the head 64 and the flange 54.

With the base 50 centered over the processor 12 and the spring plungers 60 aligned with holes in the motherboard 10, the base 50 is lowered into contact with the top surface of the processor 12 and the head 64 of each spring plunger 60 is pushed downward to force the plunger tip 62 to collapse, pass through the hole in the motherboard 10, and re-expand on the other side of the motherboard to prevent the plunger tip from being easily pulled back through the hole. The spring 68 then pushes upward beneath the head 64 and downward on the flange 54, which urges the flat central portion of the base 50 into contact with the top of the processor 12. The length of the shaft 66 should be long enough to extend through the spring 68, the flange 54 and the motherboard 10, but should be short enough that the head 64 of each spring plunger 60 will not interfere with rotation of the fin support 16 when fully installed in an operable position as shown in FIG. 11.

FIGS. 13 and 14 are perspective views of an alternative embodiment of a spring plunger 70 that can be used to secure the base 50 of FIG. 12 in contact with a processor. The spring plunger 70 is substantially similar to the spring plunger 60 of FIGS. 11 and 12, except that the head 74 has a grip 75 to facilitate manual turning, and the plunger tip 72 forms a latch arm that is perpendicular to the shaft 76. The plunger tip 72 is adapted to be aligned with and then pushed through an elongate slot 80 in the mother board 10, rotated ninety degrees to misalign the plunger tip 72 and the elongate slot 80, and released. In the released position, the spring 78 maintains a force against the head 74 to retain the base in contact with the processor on the motherboard.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A heat sink, comprising:
 a thermally conductive base secured in contact with a heat-generating electronic device secured to a circuit board;
 a thermally conductive fin support having a base side, a fin side and a plurality of fins extending from the fin side, wherein the base side contacts the base, and wherein the fin support has an overhanging portion that extends beyond an edge of the base to obstruct access to an overhanged portion of the circuit board proximal to the heat-generating electronic device; and
 a pivot member pivotally coupling the fin support to the base to facilitate rotation of the fin support relative to the base about the pivot member between a first operable position obstructing access to the overhanged portion of the circuit board and a second operable position to facilitate access to an electrical contact within the overhanged portion, wherein the base side of the fin support is in face-to-face contact with the base in each of the first operable position and the second operable position to facilitate heat transfer from the base to the fin support in each of the first operable position and the second operable position.

2. The heat sink of claim 1, wherein the pivot member is a fastener.

3. The heat sink of claim 2, wherein the pivot member is a screw.

4. The heat sink of claim 3, wherein the screw is a machine screw having a head, a shaft and threads, wherein the head is larger in diameter than the shaft to provide an independent conductive path from the base to the fin support.

5. The heat sink of claim 1, further comprising:
 an auxiliary coupling to urge the base side of the fin support against the base with the fin support in the first operable position.

6. The heat sink of claim 1, wherein the pivot member is offset relative to a center of the base.

7. The heat sink of claim 1, wherein the overhanging portion of the fin support obstructing access to the overhanged portion of the circuit board is disposed along a first edge of the base in the first operable position and is moved to along a second edge of the base in the second operable position.

8. The heat sink of claim 1, wherein the overhanging portion of the fin support that obstructs access to the overhanged portion of the circuit board in the first operable position obstructs access to a second portion of the circuit board proximal to the heat-generating component in the second operable position.

9. The heat sink of claim 1, wherein the heat-generating component is a processor.

10. The heat sink of claim 1, further comprising:
 a protrusion on the fin support that is receivable in a detent on the base in at least one of the first operable position and the second operable position to secure the fin support against pivoting relative to the base.

11. The heat sink of claim 1, wherein the second operable position is less than one hundred eighty degrees out of phase about the pivot member from the first operable position.

12. The heat sink of claim 1, wherein the second operable position is about one hundred eighty degrees out of phase about the pivot member from the first operable position.

13. A method, comprising:
 securing a heat-generating electronic device to a circuit board;
 engaging the heat-generating electronic device with a base of a heat sink;
 engaging the base of the heat sink with a base side of a fin support larger in area than the base, wherein the fin support obstructs access to at least one contact within an overhanged portion of the circuit board proximal the heat-generating electronic device;
 supporting a plurality of fins on a fin side of the fin support;
 coupling the fin support to the base with a fastener;
 providing an electrical current to the heat-generating electronic device;
 conducting heat from the heat-generating electronic device through the base to the fin support;
 dissipating heat from the fin support through the plurality of fins;

sliding the fin support along the base to rotate the fin support relative to the base about the fastener from a first operable position to a second operable position and to allow access to the at least one contact, wherein the base side of the fin support is in face-to-face contact with the base in each of the first operable position and the second operable position to facilitate heat transfer from the base to the fin support in each of the first operable position and the second operable position; and accessing the at least one contact with a testing device.

14. The method of claim 13, wherein the at least one contact is accessed with the testing device while heat continues to be transferred from the heat-generating electronic device through the base to the fin support.

15. The method of claim 14, wherein the capacity to transfer heat from the base to the fin support is reduced in the second operable position of the fin support relative to the first operable position of the fin support.

16. The method of claim 15, wherein coupling the fin support to the base with a fastener comprises providing a first and a second coupling to urge the base side of the fin support against the base.

\* \* \* \* \*